(12) United States Patent
Hung

(10) Patent No.: US 6,483,236 B1
(45) Date of Patent: Nov. 19, 2002

(54) LOW-VOLTAGE ORGANIC LIGHT-EMITTING DEVICE

(75) Inventor: Liang-Sun Hung, Webster, NY (US)

(73) Assignee: Eastman Kodak Company, Rochester, NY (US)

( * ) Notice: Subject to any disclaimer, the term of this patent is extended or adjusted under 35 U.S.C. 154(b) by 0 days.

(21) Appl. No.: 09/577,778

(22) Filed: May 24, 2000

(51) Int. Cl.[7] .................................................. H01J 1/62
(52) U.S. Cl. ...................................... 313/506; 313/504
(58) Field of Search ................................ 313/504, 506, 313/499, 503, 507

(56) References Cited

U.S. PATENT DOCUMENTS

| 4,356,429 | A | | 10/1982 | Tang ........................... 313/503 |
| 4,539,507 | A | | 9/1985 | VanSlyke et al. ............ 313/504 |
| 4,720,432 | A | | 1/1988 | VanSlyke et al. ............ 428/457 |
| 4,769,292 | A | | 9/1988 | Tang et al. .................. 428/690 |
| 4,885,211 | A | | 12/1989 | Tang et al. .................. 428/457 |
| 5,047,687 | A | | 9/1991 | VanSlyke ..................... 313/503 |
| 5,059,862 | A | | 10/1991 | VanSlyke et al. ............ 313/503 |
| 5,061,569 | A | | 10/1991 | VanSlyke et al. ............ 428/457 |
| 5,652,067 | A | * | 7/1997 | Ito et al. ...................... 428/690 |
| 5,677,572 | A | * | 10/1997 | Hung et al. .................. 257/750 |
| 5,776,622 | A | | 7/1998 | Hung et al. .................. 428/690 |
| 6,069,442 | A | * | 5/2000 | Hung et al. .................. 313/504 |
| 6,180,217 | B1 | * | 1/2001 | Ueda et al. ................... 428/212 |
| 6,208,077 | B1 | * | 3/2001 | Hung .......................... 313/506 |
| 6,278,236 | B1 | * | 8/2001 | Madathil et al. ............. 313/504 |
| 6,291,116 | B1 | * | 9/2001 | Wolk et al. .................... 430/14 |
| 6,339,288 | B1 | * | 1/2002 | Qian et al. ................... 313/498 |

OTHER PUBLICATIONS

Hamada et al., *Appl. Phys. Lett.* 71, 3338 (1997).
Kido and Matsumoto, *Appl. Phys. Lett.* 73, 2866 (1998).

* cited by examiner

*Primary Examiner*—Robert H. Kim
*Assistant Examiner*—Jurie Yun
(74) *Attorney, Agent, or Firm*—Raymond L. Owens

(57) ABSTRACT

A low-voltage organic light-emitting device has a light-transmissive hole-injecting electrode on a light-transmissive substrate, and formed over the hole-injecting electrode, in sequence, an organic hole-transporting layer, an organic light-emitting layer, a bi-layer interfacial structure, an electron-transporting layer having an electron affinity higher than an electron affinity of the light-emitting layer, and an electron-injecting electrode. The bi-layer interfacial structure provides effective electron transport from the electron-transporting layer to the light-emitting layer.

11 Claims, 4 Drawing Sheets

LOW-VOLTAGE ORGANIC LIGHT-EMITTING DEVICE

CROSS REFERENCE TO RELATED APPLICATIONS

Reference is made to commonly assigned U.S. patent application Ser. No. 09/577,092 filed concurrently herewith entitled "Reduction of Ambient-Light Reflection in Organic Light-Emitting Devices" by Liang-Sun Hung et al., the disclosure of which is incorporated herein by reference.

FIELD OF THE INVENTION

The present invention relates generally to organic light-emitting devices and particularly to a low-voltage organic light-emitting device.

BACKGROUND OF THE INVENTION

In a normal configuration of an organic light-emitting device, the device structure comprises, in sequence, a glass support, a transparent conductive hole-injecting electrode, an organic hole-transporting layer, an organic light-emitting layer, an organic electron-transporting layer, and an electron-injecting electrode. In order to operate this device at desirably low-voltage, the electron-transporting material is required to have a high electron mobility. However, most effective electron-transporting materials possess a comparably large electron affinity whereas materials commonly used to form the light-emitting layer have a lower electron affinity, thus blocking or impeding electron transport from the electron-transporting layer into the light emission layer. Therefore, interfacial modification between the electron-transporting layer and the light-emitting layer is important to achieve improved electron transport from the electron-transporting layer into the light-emitting layer.

Furthermore, aluminum chelate (Alq) materials that can be used in forming the organic electron-transporting layer have a relatively low electron mobility reported to be as low as $1.4 \times 10^{-6}$ cm$^2$/Vs at an electric field of $4 \times 10^5$ V/cm. Thus, even if both the hole-injecting electrode and the electron-injecting electrode were injecting respective electrical charge carriers perfectly into the hole-transporting and electron-transporting layers respectively, the low electron mobility of Alq becomes a limiting factor in an effort to reduction of the voltage applied between the two electrodes in order to provide efficient operation of the organic light-emitting device. In practical applications of such devices, it is very important to operate them at low-voltages and corresponding low power consumption. Moreover, the lowering of operating voltage and power consumption would also lead to improved device operational stability by reducing heat generation.

Various efforts have been made to develop improved electron-transporting materials. For example, Hamada et al. reported in *Appl. Phys. Lett.* 71, 3338 (1997) that bis(5-hydroxyflavonato)beryllium has a better electron transport feature than Alq. However, a voltage of 8V was still required to generate a luminance of 2000–3000 cd/m$^2$ in an organic light-emitting device using this material in an electron-transporting layer.

Kido and Matsumoto reported in *App. Phys. Lett.* 73, 2866 (1998) about a lithium-doped Alq layer as an electron-transporting layer having an increased electron conductivity compared to undoped Alq. However, it is generally believed that lithium diffuses readily in most organic materials and such lithium diffusion would create non-radiative recombination centers, thus shortening the device lifetime. This clearly indicates the importance of searching for an effective and stable electron transporting material to replace Alq in order to provide a low-voltage organic light-emitting device.

SUMMARY OF THE INVENTION

It is an object of the present invention to provide a low-voltage organic light-emitting device.

It is another object of the present invention to provide a low-voltage organic light-emitting device having an improved electron-transporting layer.

It is a further object of the present invention to provide a low-voltage organic light-emitting device having a bi-layer interfacial structure formed between the electron-transporting layer and an organic light-emitting layer so as to provide effective electron transport from the electron-transporting layer to the organic light-emitting layer.

These objects are achieved in a low-voltage organic light-emitting ice, comprising:

a) a substrate;

b) a hole-injecting electrode formed over the substrate;

c) an organic hole-transporting layer formed over the hole-injecting electrode;

d) an organic light-emitting layer formed over the hole-transporting layer, the organic light-emitting layer being an n-type semiconductor characterized by an electron affinity and an electron mobility;

e) a bi-layer interfacial structure formed over the organic light-emitting layer;

f) an electron-transporting layer formed over the bi-layer interfacial structure, the electron-transporting layer being an n-type semiconductor characterized by an electron affinity and an electron mobility which are higher than the electron affinity and the electron mobility of the organic light-emitting layer wherein the bi-layer interfacial structure provides effective electron transport from the electron-transporting layer to the organic light-emitting layer; and g) an electron-injecting electrode formed over the electron-transporting layer.

BRIEF DESCRIPTION OF THE DRAWINGS

FIGS. 1 and 2 are necessarily of a schematic nature, since thicknesses of the individual layers are too thin, and thickness differences of the various elements too great to permit depiction to scale or to permit convenient proportionate scaling.

DETAILED DESCRIPTION OF THE EMBODIMENTS

In order to more fully appreciate the construction and performance of the low-voltage organic light-emitting device of the invention, the prior art organic light-emitting device 100 of FIG. 1 will be described.

Figure 2:
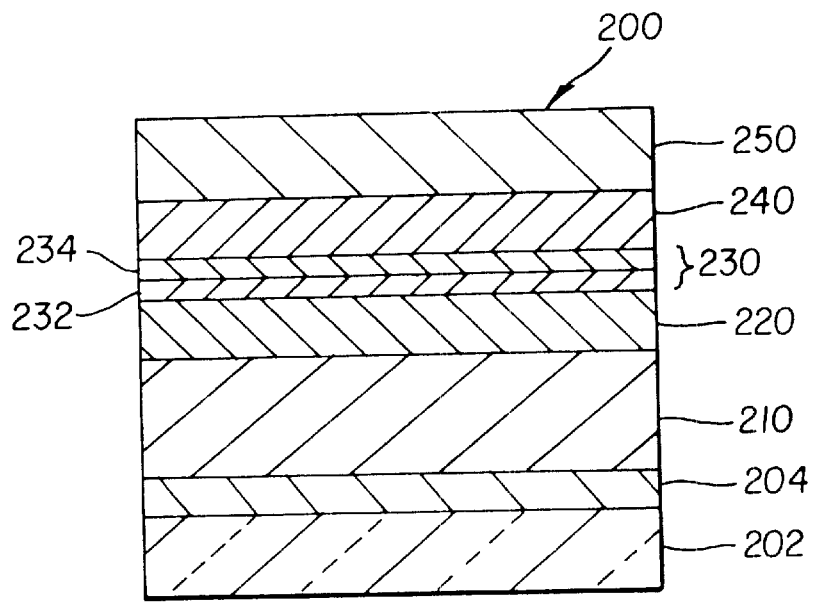
FIG. 2 is a schematic cross section view of a low-voltage organic light-emitting device constructed in accordance with the present invention, and having a bi-layer interfacial structure disposed between an organic light-emitting layer and an electron-transporting layer.

Elements and features common to the prior art device and the inventive device of FIG. 2 have corresponding numeral designations.

Figure 1:
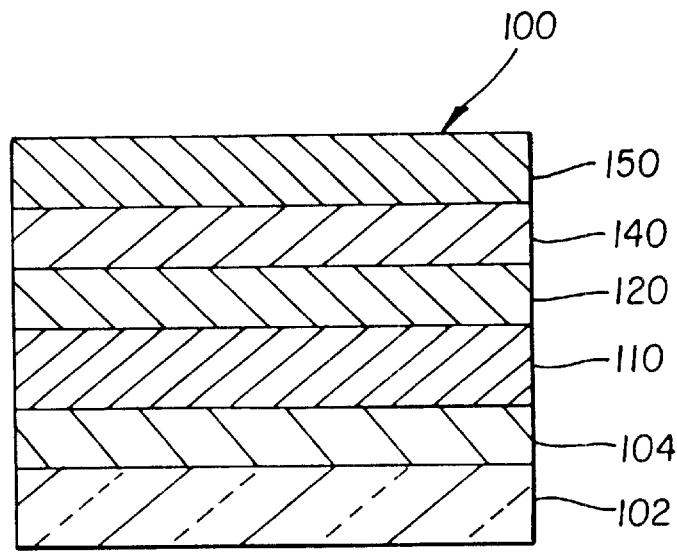
FIG. 1 shows a schematic cross section of an organic light-emitting device constructed in accordance with recent prior art.

In FIG. 1, an organic light-emitting device 100 has a light-transmissive substrate 102 on which is formed a light-transmissive hole-injecting electrode 104. The substrate 102 can be glass or quartz, and the electrode 104 is preferably a thin layer of indium tin oxide (ITO) formed over the substrate 102. An organic hole-transporting layer 110 is formed over the hole-injecting electrode 104, an organic light-emitting layer 120 is formed over the organic hole-transporting layer 110, and an organic electron transporting layer 140 is formed over the light-emitting layer 120. Finally a electron injecting electrode 150 is deposited over the electron-transporting layer 140.

The organic light-emitting device 100 is operated by applying an electrical potential (not shown) between the electron-injecting electrode 150 and the hole-injecting electrode 104 such that electrode 150 is at a more negative potential with respect to the electrode 104. In this case, electrons (negative charge carriers) are injected from the electrode 150 through the organic electron-transporting layer 140 into the organic light-emitting layer 120. Simultaneously, holes (positive charge carriers) are injected from the electrode 104 into the organic hole-transporting layer 110. The electrons and holes recombine in the light-emitting layer 120 near the interface between the layer 110 and 120. This electron-hole recombination results in light emission from the layer 120. Light is emitted from the device through the light-transmissive electrode 104 and through the light-transmissive substrate 102.

The organic materials from which the layers 110, 120, and 140 are formed can be selected from among materials (configurations of layers, and preferred layer thicknesses of conventional organic light-emitting devices) such as those described by Tang U.S. Pat. No. 4,356,249; VanSlyke et al. U.S. Pat. No. 4,539,507; VanSlyke et al. U.S. Pat. No. 4,720,432; Tang et al. U.S. Pat. No. 4,885,221; Tang et al. U.S. Pat. No. 4,769,292; VanSlyke et al. U.S. Pat. No. 5,047,687; VanSlyke et al. U.S. Pat. No. 5,059,862; and VanSlyke et al. U.S. Pat. No. 5,061,569, the disclosures of which are herein incorporated by reference.

The organic layers 110, 120, and 140 as well as the electron-injecting electrode 150 can be formed by well known vapor deposition techniques.

The color or hue of light emitted from the device 100 during operation can be selected by incorporating a fluorescent organic material into a portion of the organic light-emitting layer 120. During operation of the device 100, the organic hole-transporting layer 110 transports positive charge carriers (holes) from the hole-injecting electrode 104 towards the light-emitting layer 120. Accordingly, the layer 110 functions as a p-type semiconductor. Similarly, the organic electron-transporting layer 140 transports negative charge carriers (electrons) injected from the electrode 150 towards the light-emitting layer 120. Accordingly, the layer 140 functions as an n-type organic semiconductor.

Turning to FIG. 2, the low-voltage organic light-emitting device 200 of the invention has a light-transmissive substrate 202, a light-transmissive hole-injecting electrode 204 formed over the substrate, and an organic hole-transporting layer 210 formed over the hole-injecting electrode 204. An organic light-emitting layer 220 is formed over the hole-transporting layer 210, substantially identical to the light-emitting material from which the organic light-emitting layer 120 of the prior art device 100 is formed. The organic light-emitting layer 220 can contain a fluorescent material, also referred to as a dopant, to select the color or hue of light emitted by the device, or it can be a layer formed of undoped electron-transporting material. During operation of the inventive device 200, electron-hole recombination in the light-emitting layer 220 results in light emission, as described previously.

A bi-layer interfacial structure 230 comprises an alkali fluoride interfacial layer 232, preferably a lithium fluoride layer, formed by vapor deposition over and in contact with the organic light-emitting layer 220, and an aluminum interfacial layer 234 formed by vapor deposition over the interfacial layer 232. Other alkali fluorides useful in forming the interfacial layer 232 include sodium fluoride, potassium fluoride, rubidium fluoride, and cesium fluoride. A preferred thickness of the alkali fluoride interfacial layer is in a range of 0.1 to 1.5 nm. A preferred thickness range of the aluminum interfacial layer is 0.1 to 2 nm.

An electron-transporting layer 240 is formed over and in contact with the aluminum interfacial layer 234. An electron-injecting electrode 250 is formed by vapor deposition over the electron-transporting layer 240.

It has been recognized, as indicated in the section "Background of the Invention" that electron transport through electron-transporting layers, such as the layer 140 of the prior art device 100, is limited by a low electron mobility, particularly at layer thicknesses of the organic electron-transporting layer 140 which are typically in a range of 30 to 100 nm. Thus, it has been contemplated to find an electron-transporting material, i.e. an n-type semiconductor having improved electron-transport properties (for example, improved electron mobility) for construction of the electron-transporting layer. It has now been found unexpectedly that metal-containing phthalocyanine materials have substantially improved electron-transporting properties compared to previously used aluminum chelate materials such as, for example, aluminum trisoxine materials. Copper phthalocyanine is a particularly preferred material for forming the electron-transporting layer 240 of the light-emitting device 200 in accordance with the present invention. Another highly preferred material for forming the electron-transporting layer 240 is zinc oxide when prepared to be oxygen-deficient (denoted in abbreviated form as $ZnO_{1-x}$).

Although electron-transporting layers formed from copper phthalocyanine or from zinc oxide showed substantially improved electron-transporting properties in isolated layers between electrodes, the performance of such electron-transporting layers appeared substantially reduced when such layers were formed directly over an organic light-emitting layer constructed from an aluminum trisoxine material, such as the light-emitting layer 220. It was then recognized that a potential barrier, also known as an energy level barrier, was likely to be formed at the interface between the improved electron-transporting layer and the light-emitting layer. Such barrier against effective electron-transport from one n-type semiconductor (copper phthalocyanine or zinc oxide) into a second n-type semiconductor (aluminum trisoxine) could be attributed to a substantially higher electron affinity of copper phthalocyanine or of zinc oxide, compared to an electron affinity of the aluminum trisoxine.

It was then discovered that a bi-layer interfacial structure 230, interposed between the improved electron-transporting layer 240 and the organic light-emitting layer 220 provided for effective electron transport from the electron-transporting layer 240 across the interfacial structure 230 into the light-emitting layer 220. As will become apparent from a review of device operational results shown in FIGS. 3, 4, and 5, the combination of an improved electron-transporting layer 240 with a bi-layer interfacial structure provides an organic light-emitting device which can be operated at low drive voltages.

EXAMPLES

The following examples are presented for a further understanding of the invention. For purposes of brevity, the materials and layers formed therefrom will be abbreviated as given below:

NPB: 4,4'-bis-[1-naphthyl)-N-phenylamino]-bi-phenyl; used in forming the hole-transporting layers 110, 210

Alq: tris(8-quinolinato-N1,08)-aluminum, also known as aluminum trisoxine; used in forming the light-emitting layers 120 and 220 as well as the electron-transporting layer 140

LiF: lithium fluoride; used in forming the interfacial layer 232

Al: aluminum; used in forming the interfacial layer 234

CuPc: copper phthalocyanine; used in forming the electron-transporting layer 240

MgAg: magnesium:silver at a ratio of 10:1 by volume; used in forming the electron-injecting electrodes 150 and 250

I. Preparation of the Prior Art Organic Light-emitting Device (see FIG. 1)

a) a light-transmissive ITO-coated glass plate was ultra-sonicated in a commercial detergent, rinsed in deionized water, degreased in toluene vapor, and contacted by a strong oxidizing agent;

b) a 90 nm thick NPB hole-transporting layer was deposited on the ITO by conventional thermal vapor deposition;

c) a 75 nm thick Alq electron-transporting layer was deposited over the NPB layer by conventional thermal vapor deposition;

d) g) a 200 nm thick MgAg electron-injecting electrode was deposited over the Alq layer by conventional thermal vapor co-deposition from two sources (Mg and Ag).

Figure 3:
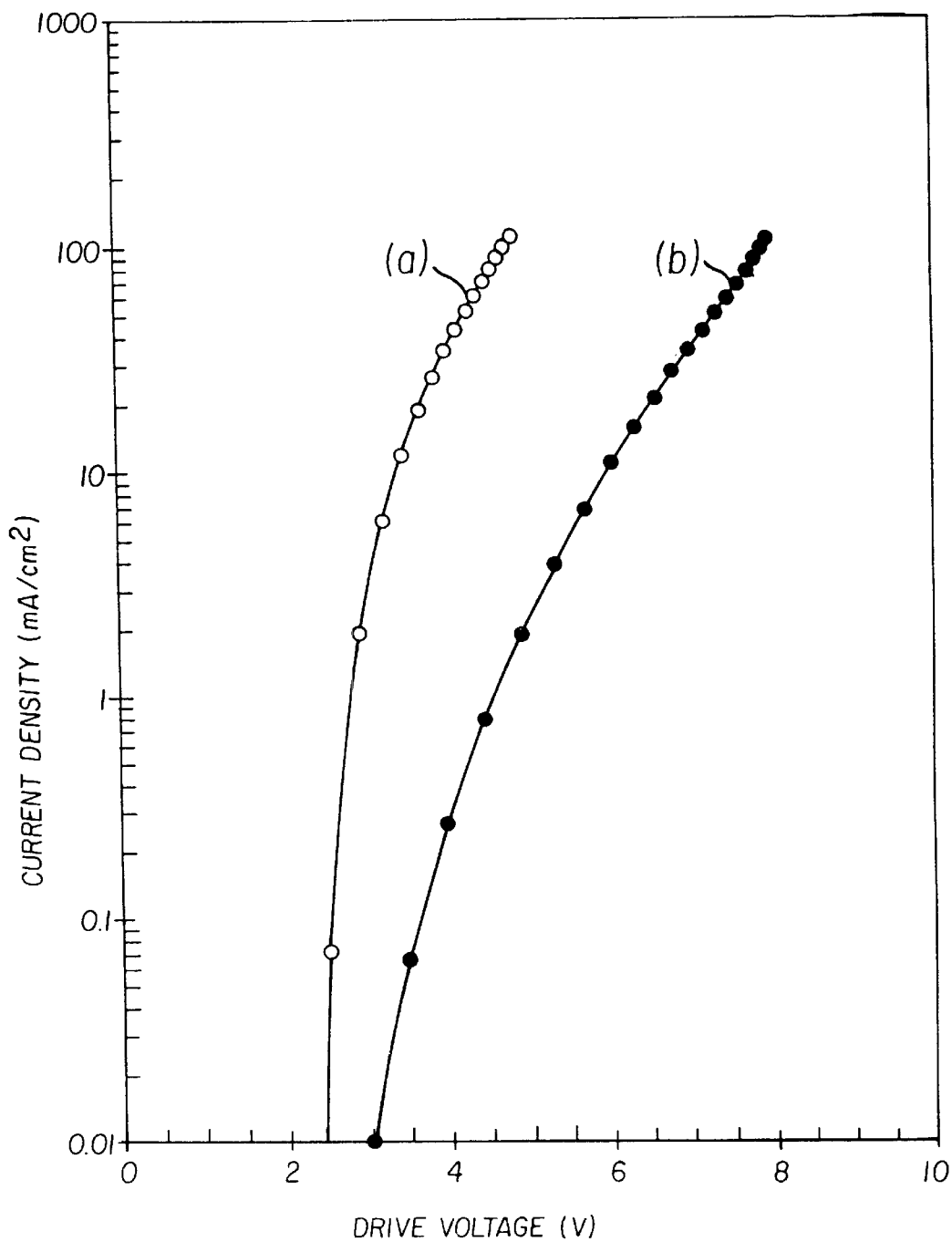
FIG. 3 shows in graphic form current-voltage relationships of the prior art device of FIG. 1 and of the inventive device of FIG. 2.
Figure 4:
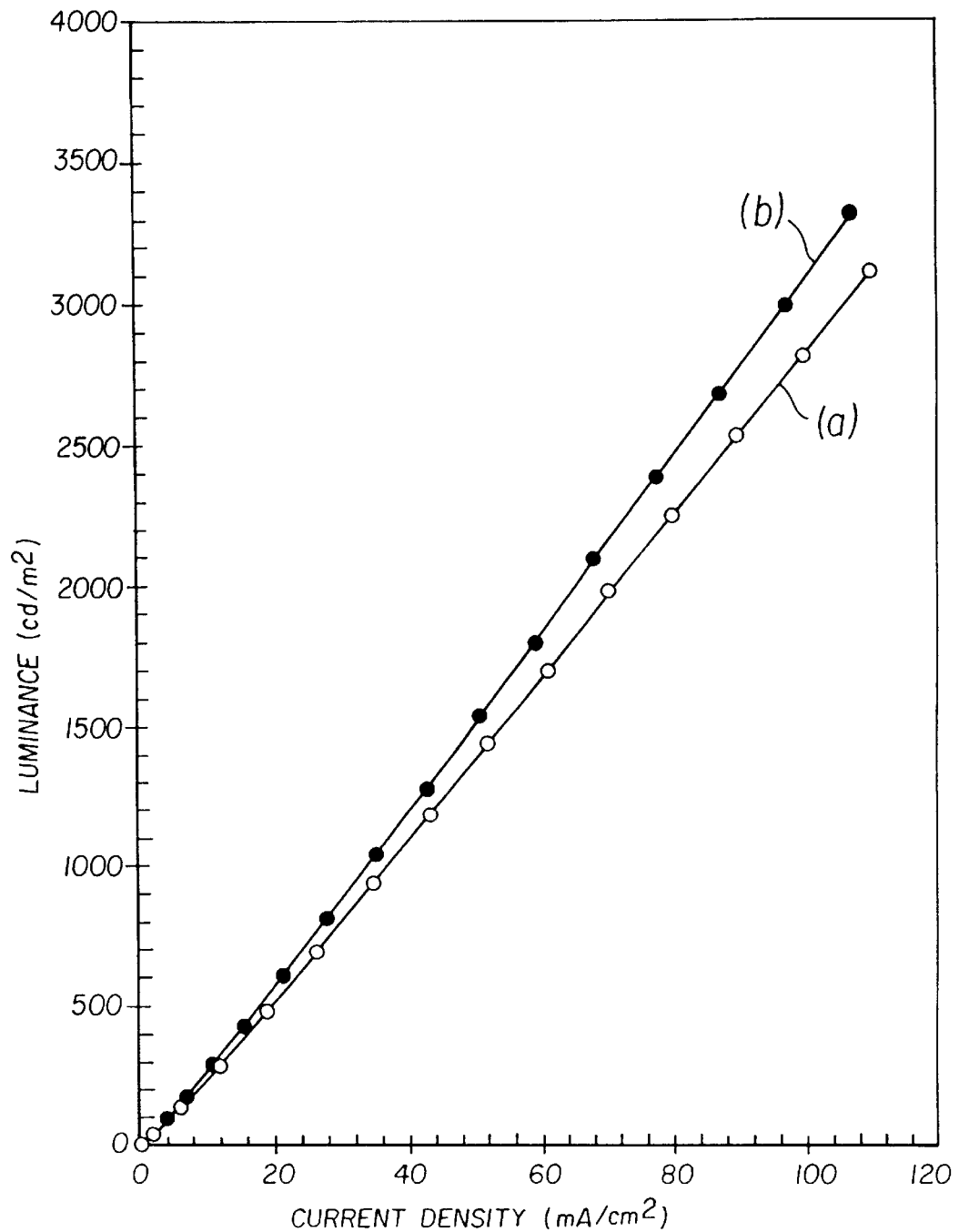
FIG. 4 shows in graphic form a relationship between luminance and current density for the prior art device of FIG. 1 and for the inventive device of FIG. 2.
Figure 5:
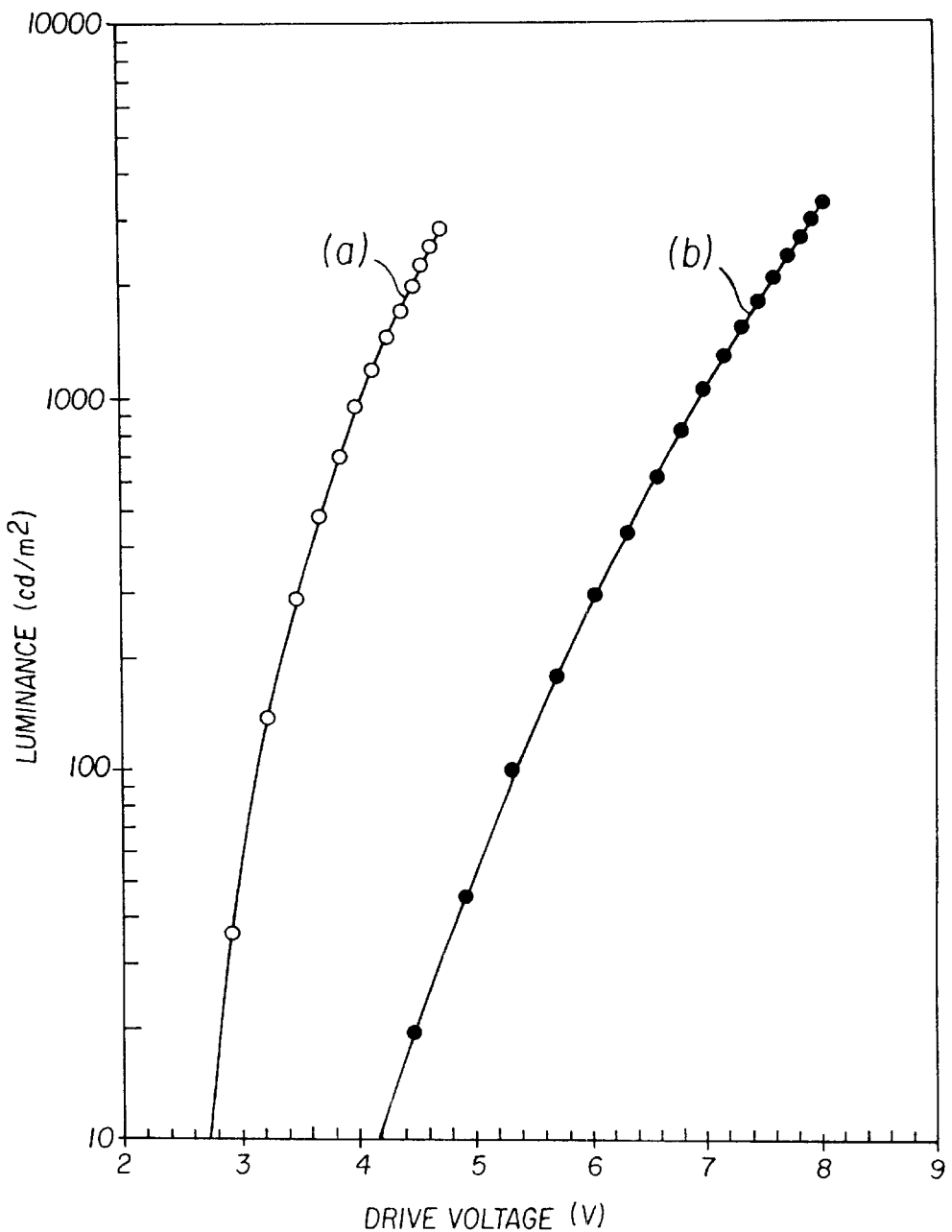
FIG. 5 shows in graphic form a relationship between luminance and drive voltage for the prior art device of FIG. 1 and for the inventive device of FIG. 2.

The above structure of this prior art device is abbreviated in FIGS. 3, 4, and 5 as NPB(90)/Alq(75)/MgAg

II. Preparation of the Low-voltage Organic Light-emitting Device (see FIG. 2)

a) a light-transmissive ITO-coated glass plate was ultra-sonicated in a commercial detergent, rinsed in deionized water, degreased in toluene vapor, and contacted by a strong oxidizing agent;

b) a 120 nm thick NPB hole-transporting layer was deposited on the ITO by conventional thermal vapor deposition;

c) a 35 nm thick Alq light-emitting (and electron-transporting) layer was deposited over the NPB layer by conventional thermal vapor deposition;

d) a 0.3 nm thick LiF interfacial layer was deposited over the Alq layer by conventional thermal vapor deposition;

e) a 0.6 nm thick Al interfacial layer was deposited over the LiF interfacial layer by conventional thermal vapor deposition;

f) a 40 nm thick CuPc electron-transporting layer was deposited over the Al interfacial layer by conventional thermal vapor deposition; and g) a 200 nm thick MgAg electron-injecting electrode was deposited over the CuPc layer by conventional thermal vapor co-deposition from two sources (Mg and Ag).

The above structure of this low-voltage device is abbreviated in FIGS. 3, 4, and 5 as NPB(120)/Alq(35)/LiF/Al/CuPc(40)MgAg Each of the organic light-emitting devices was tested by applying a variable drive voltage between the device electrodes such that the ITO hole-injecting electrode (104, 204) was positive with respect to the corresponding electron-injecting electrode (150, 250).

FIG. 3 shows a current density-drive voltage relationship for the 15 device of the present invention (trace a) and for the prior art device (trace b). It is evident that the inventive device requires substantially lower drive voltages to achieve a particular current density than the prior art device.

FIG. 4 shows a luminance-current density relationship for the device of the present invention (trace a) and for the prior art device (trace b). In this presentation, the inventive device exhibits a luminance at each current density which is almost identical to the luminance of the prior art device.

FIG. 5 shows a luminance-drive voltage relationship for the device of the present invention (trace a) and for the prior art device (trace b). The low-voltage performance (and attendant reduced power consumption and/or power dissipation) of the inventive low-voltage organic light-emitting device is clearly evident.

The invention has been described in detail with particular reference to certain preferred embodiments thereof, but it will be understood that variations and modifications can be effected within the spirit and scope of the invention.

PARTS LIST 100 organic light-emitting device (PRIOR ART)
102 light-transmissive substrate
104 light-transmissive hole-injecting electrode
110 organic hole-transporting layer
120 organic light-emitting layer
140 organic electron-transporting layer
150 electron-injecting electrode (magnesium:silver)
200 low-voltage organic light-emitting device
202 light-transmissive substrate
204 light-transmissive hole-injecting electrode
210 organic hole-transporting layer
220 organic light-emitting layer
230 bi-layer interfacial structure
232 lithium fluoride interfacial layer
234 aluminum interfacial layer
240 electron-transporting layer
250 electron-injecting electrode (magnesium:silver)

What is claimed is:

1. A low-voltage organic light-emitting device, comprising:

a) a substrate;

b) a hole-injecting electrode formed over the substrate;

c) an organic hole-transporting layer formed over the hole-injecting electrode;

d) an organic light-emitting layer formed over the hole-transporting layer, the organic light-emitting layer being an n-type semiconductor characterized by an electron affinity and an electron mobility;

e) a bi-layer interfacial structure includes a thin layer of an alkaline metal fluoride formed on the organic light-emitting layer, and a thin layer having a reactive metal formed on the alkaline metal fluoride layer;

f) an electron-transporting layer formed over the bi-layer interfacial structure, the electron-transporting layer being an n-type semiconductor characterized by an electron affinity and an electron mobility which are higher than the electron affinity and the electron mobility of the organic light-emitting layer wherein the bi-layer interfacial structure provides effective electron transport from the electron-transporting layer to the organic light-emitting layer; and g) an electron-injecting electrode formed over the electron-transporting layer.

2. The low-voltage organic light-emitting device of claim 1 wherein the substrate and the hole-injecting electrode are light-transmissive.

3. The low-voltage organic light-emitting device of claim 1 wherein the organic light-emitting layer includes a metal chelate material.

4. The low-voltage organic light-emitting device of claim 3 wherein the metal chelate material includes aluminum trisoxine.

5. The low-voltage organic light-emitting device of claim 1 wherein the electron-transporting layer includes a metal-containing phthalocyanine material.

6. The low-voltage organic light-emitting device of claim 5 wherein the metal-containing phthalocyanine material includes copper phthalocyanine.

7. The low-voltage organic light-emitting device of claim 1 wherein the reactive metal in the bilayer interfacial structure includes aluminum.

8. The low-voltage organic light-emitting device of claim 7 wherein the alkali fluoride layer includes lithium fluoride, sodium fluoride, potassium fluoride, rubidium fluoride, or cesium fluoride.

9. The low-voltage organic light-emitting device of claim 7 wherein the alkali metal-fluoride layer includes lithium fluoride.

10. The low-voltage organic light-emitting device of claim 1 wherein the electron-transporting layer includes a layer of oxygen-deficient zinc oxide.

11. The low-voltage organic light-emitting device of claim 7 wherein the alkali metal fluoride layer has a thickness in a range of from 0.1 to 1.5 nm, and the aluminum layer has a thickness in a range of from 0.1 to 2 nm.

* * * * *